United States Patent [19]

Keller

[11] Patent Number: 5,406,067
[45] Date of Patent: Apr. 11, 1995

[54] ELECTRICALLY ADJUSTED MOSAIC FILTER FOR USE AS AN OPTICAL SENSOR IN AN OPTICAL MEASUREMENT INSTRUMENT

[75] Inventor: Peter A. Keller, Aloha, Oreg.

[73] Assignee: Tektronix, Inc., Wilsonville, Oreg.

[21] Appl. No.: 108,353

[22] Filed: Aug. 17, 1993

[51] Int. Cl.⁶ .............................................. H01J 40/14
[52] U.S. Cl. .................... 250/208.1; 250/226; 348/237
[58] Field of Search ............... 250/208.1, 208.2, 208.4, 250/214 R, 214 A, 226; 356/419, 414, 405; 348/237, 643; 307/311; 330/86, 84, 124 R, 126

[56] References Cited

U.S. PATENT DOCUMENTS

| | | | |
|---|---|---|---|
| 3,737,239 | 6/1973 | Adams et al. | 250/226 |
| 3,984,185 | 10/1976 | Vinatzer | 250/226 |
| 4,194,839 | 3/1980 | Knop | 250/226 |
| 4,517,588 | 5/1985 | Kuwayama et al. | 348/237 |
| 5,239,175 | 8/1993 | Jawad et al. | 250/226 |

*Primary Examiner*—David C. Nelms
*Assistant Examiner*—Que T. Le
*Attorney, Agent, or Firm*—Bucher William K.

[57] ABSTRACT

An optical sensor has an electrically adjusted mosaic filter in which each optical filter element of the mosaic filter covers a photosensitive device or region disposed adjacent to the filter. The electrical signals from each photosensitive region or device is amplified, varied and summed to produce an optical sensor output substantially matching a desired spectral response curve as a function of varying the amplified outputs of the photosensitive regions.

12 Claims, 3 Drawing Sheets

ELECTRICALLY ADJUSTED MOSAIC FILTER FOR USE AS AN OPTICAL SENSOR IN AN OPTICAL MEASUREMENT INSTRUMENT

BACKGROUND OF THE INVENTION

The present invention relates to optical measurement instruments and more particularly to an improved optical sensor for such instruments having an electrically adjusted mosaic filter.

Optical measurement instruments, such as photometers, radiometers and the like, are used to measure spatial and spectral qualities of radiation in the ultraviolet to infrared portion of the electromagnetic spectrum being emitted, reflected or transmitted by an object. Most measurements of radiation in this spectral region fall into one of two categories, radiation received by a surface and radiation emitted or scattered by a surface. Photometers measure radiation in the visible light spectrum and use the human eye or its equivalent as the sensor. Radiometers measure radiation from the ultraviolet through the infrared spectrum and are designed to have a nearly equal response to as wide of range of wavelengths as possible.

Two basic designs are used in photometers, one where the human eye is the sensor and the other where a photosensitive device, such as a vacuum photocell, photoconductive cell, silicon photodiode or the like, is used. The human eye has a spectral sensitivity that responds differently to light of different colors and has a maximum sensitivity in the yellow/green region. Through experimentation, the relative radiant sensitivity of the human eye to specific wavelengths of light has been determined and a photopic curve has been defined by the Commission Internationale de L'Eclariage (CIE) and universally accepted as the standard for the spectral sensitivity of the average human eye.

The photosensitive devices used in photometers have spectral responses that do not match that of the average human as defined by the CIE photopic curve. To use these devices in photometers, optical filters are placed in front of the devices to selectively absorb the wavelengths of light to correct the sensor's response to that of the average human eye. There are two basic type of optical filters used in optical sensors for photometers, a homogeneous filter or subtractive filter and a mosaic or additive filter. The homogeneous filter is constructed out of two or more pieces of absorbing filter glasses cemented together. The pieces of glass used are uniform in transmittance across their surfaces. Radiation incident on the filter is modified by passing, in turn, through each of the spectrally selective filter glasses, which remove parts of the incident radiation spectrum by absorption. The mosaic filter is constructed using a homogeneous glass or glasses that conform somewhat to the CIE photopic curve. Smaller pieces of glass filters are cemented to the surface of the homogeneous glass to decease the transmittance in specific spectral regions. By adjusting the position and size of the smaller glass filter pieces, the filter's transmittance can be made to conform more accurately to the photopic curve. Accuracy of the photopic correction is a basic advantage of the mosaic filter over the homogeneous filter.

Having to adjust the size and position of the various glass filter pieces requires hand assembly by an experienced technician and is a major drawback to mosaic filters. Additionally, as the various pieces of filter glass are added, it is necessary to re-measure the optical sensor filter-detector combination against the CIE photopic curve.

What is needed is an optical sensor for an optical measurement instrument that does not require the selective sizing and placement of glass filter elements in order to match the sensor to an specific spectral response. Such an optical sensor should be easy to assemble without having to continually re-measure the sensor against the desired spectral response as the glass filter elements are added.

SUMMARY OF THE INVENTION

Accordingly, the present invention is an optical sensor for producing a spectral response substantially matching a desired spectral response curve. The sensor includes a mosaic filter having a plurality of optical filter elements disposed on an optical substrate with each filter element having a spectral response for selectively decreasing the transmittance of light passing through the mosaic filter in a specific spectral region. A photosensitive device is disposed adjacent to the mosaic filter and has a plurality of photosensitive regions with each region converting the spectral response of one of the optical filter elements to an electrical signal. Means are provide for amplifying and varying each of the electrical signals from the respective photosensitive regions. A summing means sums the outputs of the amplifying and varying means to produce an output substantially matching the desired spectral response curve as a function of varying the amplified outputs of the photosensitive regions.

In one aspect of the invention the amplifying and varying means are a plurality of amplifiers coupled to receive the electrical signals from respective photosensitive regions to produce output voltages proportional to the input electrical signals. Each amplifier has an individual gain adjustment for varying the amplified output of the amplifier.

In a further aspect of the present invention the varying means consists of applying correction factors to digital values representative of the amplified outputs of the photosensitive regions. The digital values are generated by an analog-to-digital converter that receives the amplified outputs of the photosensitive regions.

It is an object of the present invention to produce an optical sensor having an electrically adjusted mosaic filter.

It is another object of the invention to produce an optical sensor using a mosaic filter that does not require selective sizing and placement of optical filter elements for the mosaic filter.

It is further object of the present invention to provide an optical sensor using a mosaic filter where the matching of the spectral response of the optical sensor to a desired spectral response curve is accomplished as a function of varying the outputs of a plurality of photosensitive devices or regions of a photosensitive device.

It is a feature of the present invention to provide an optical sensor that substantially matches the spectral response of the average human eye.

It is another feature of the present invention to provide an optical sensor that produces a flat spectral response over a wide range.

The objects, advantages and novel features of the present invention are apparent from the following detailed description when read in conjunction with appended claims and attached drawings.

DETAILED DESCRIPTION OF THE PREFERRED EMBODIMENT

Figure 1:
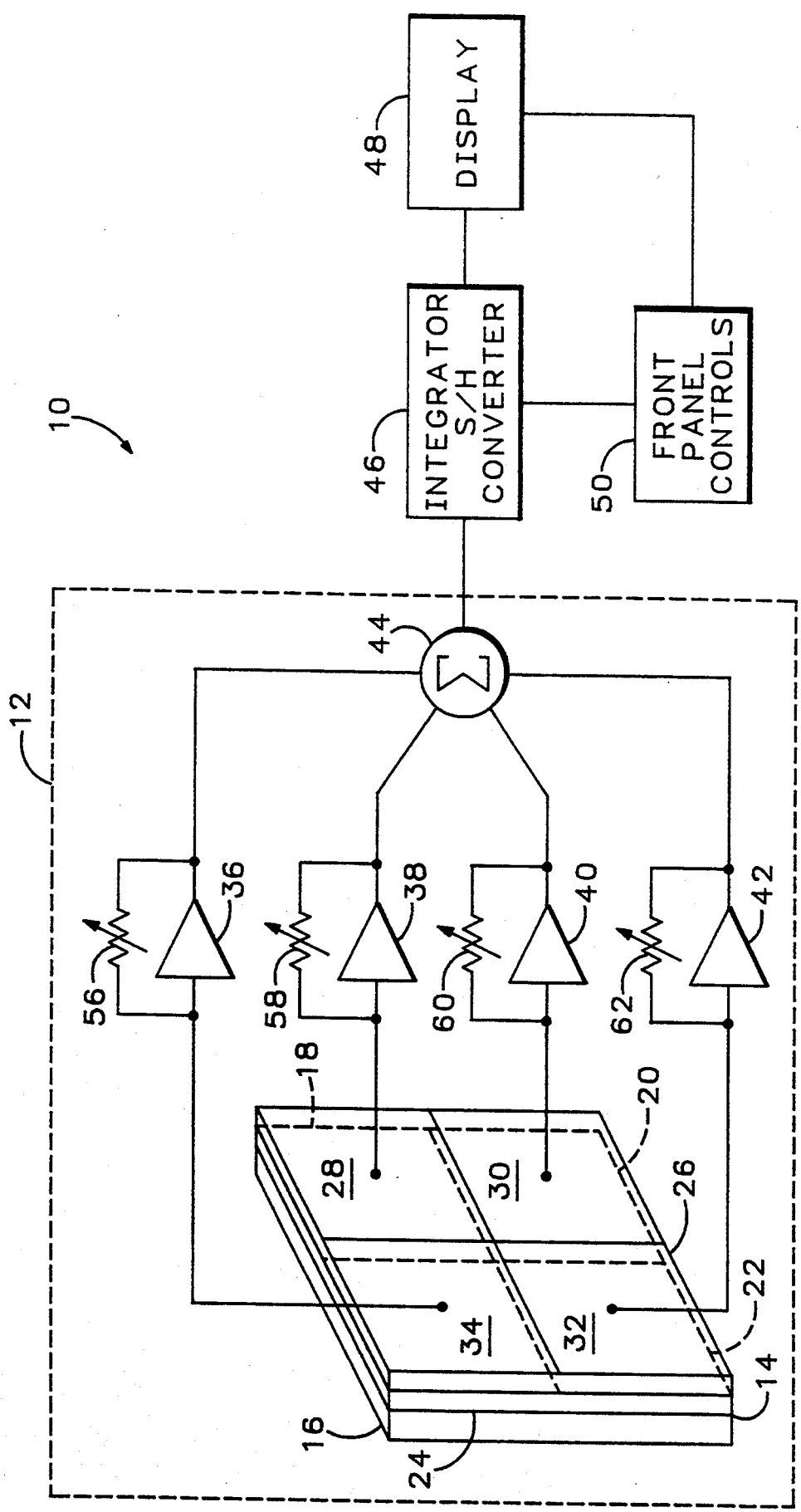
FIG. 1 is an analog implementation of the optical sensor according to the present invention as used in an optical measurement instrument.

FIG. 1 shows an optical measurement instrument 10 with an analog implementation of the optical sensor 12 according to the present invention. The optical sensor 12 includes a mosaic filter 14 composed of an optical substrate 16 having a plurality of optical filter elements 18, 20, 22, 24 mounted thereto. Disposed adjacent to the mosaic filter 14 is a photosensitive device 26 having a plurality of photosensitive regions 28, 30, 32, 34. Each region 28–32 of the photosensitive device 26 is covered by one of the optical filter elements 18–24. The photosensitive regions 28–32 are coupled to corresponding variable gain amplifiers 36, 38, 40, 42. The outputs of the variable gain amplifiers 36–42 are coupled to a summing circuit 44, such as a summing amplifier. The output of the summing circuit 44 is coupled to additional processing circuitry 46, such as an integrator circuit, sample & hold circuit, and converter circuit which converts the integrated and sample signal into an output for display 48. The processing circuitry and the display are connected to a front panel control 50.

Figure 2:
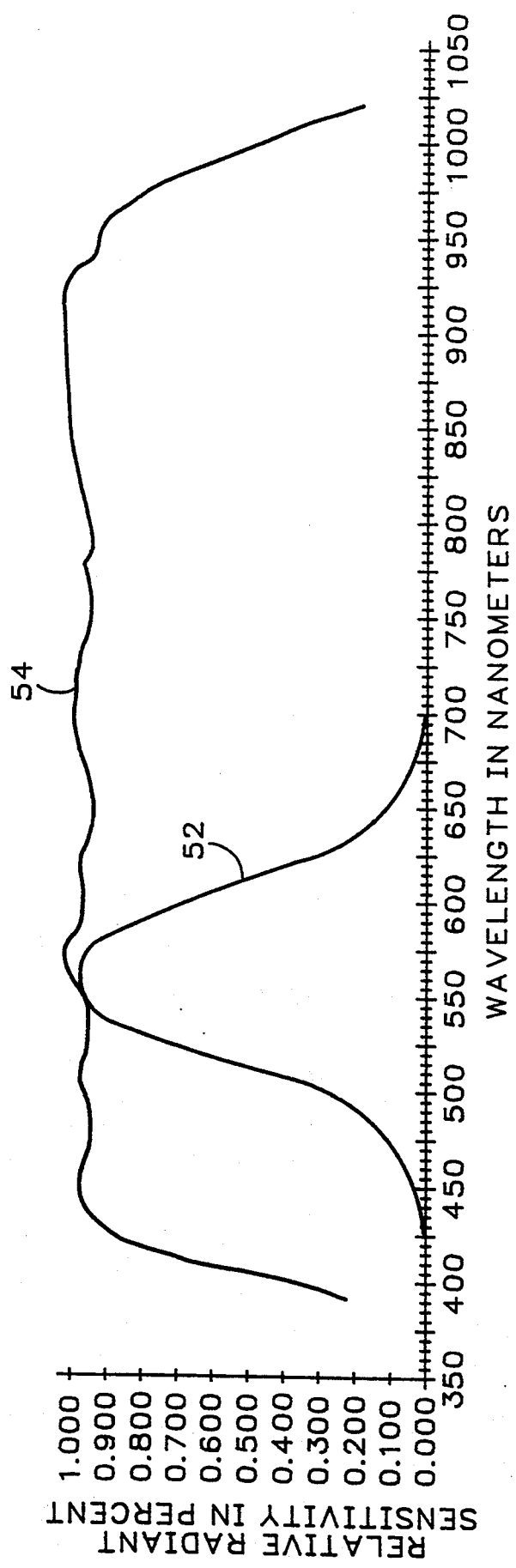
FIG. 2 is a graphical representation of a photopic spectral response curve of the average human eye and a response curve over a range from ultraviolet into the infrared as substantially matched by the optical sensor according to the present invention.

The mosaic filter 14 includes an optical substrate 16 in the form of a piece of homogeneous glass or glasses that somewhat matches a desired response curve for the optical sensor. One such desired response curve, as shown in FIG. 2, is the photopic curve 52 as defined by the Commission Internationale de L'Eclariage (CIE) and universally accepted as the standard for the spectral sensitivity of the average human eye. Another desired response curve 54 represents a nearly flat spectral response over a range of wavelengths from ultraviolet into the infrared. Smaller pieces of optical filter elements 18–24 which decrease the transmittance in specific spectral regions are mounted on the optical substrate 16. The mosaic filter 14 is shown as being rectilinear with four optical filter elements 18–24 thereon. In practicing the invention, the mosaic filter 14 is not restricted to a particular shape. Other filter shapes, such as a circular filter, work equally as well so long as each optical filter element covers a corresponding photosensitive region. Additionally, the optical sensor 12 of the present invention is not limited to four optical filter elements 18–24 in the mosaic filter 14. Any number of optical filter elements can be included in the mosaic filter 14 so long as there are a like number of photosensitive regions 28–34 associated with them. It is envisioned that as the number of optical filter elements increase, so will the accuracy of the output of the optical sensor 12 to the desired spectral response curve.

Disposed adjacent to the mosaic filter 14 is a photosensitive device 26 for converting the light passing through the filter 14 to an electrical signal. The photosensitive device 26 has a plurality of photosensitive regions 28–32 with each region covered by one of the optical filter elements 18–24. As was stated for the mosaic filter 14, the number of photosensitive regions in the photosensitive device 26 is a function of the number of optical filter elements, which has been previously described as not being limited to four. The photosensitive device 26 may be a four quadrant photodiode, a photodiode array, discrete photodiodes or the like. Each photosensitive region 28–32 of the photosensitive device 26 generates a current proportional to the spectral response of the particular optical filter element through which the light is passing. The current signals from the respective photosensitive regions 28–32 are coupled to respective inputs of transimpedance amplifiers 36–42. Each transimpedance amplifier 36–42 generates a voltage signal proportional to the respective input current signals as a function of respective feedback variable gain resistors 56, 58, 60, 62 in shunt with each of the amplifiers 36–42. The voltage outputs of the transimpedance amplifiers 36–42 are coupled to the summing circuit 44. The summed output of the summing circuit 44 is coupled to the processing circuity 46 for additional processing and displaying the output on display 48.

Calibration of the optical sensor 12 is accomplished using a light source having a spectral output covering the desired spectral response curve for the optical sensor 12. For example, in calibrating the optical sensor 12 to match the photopic response curve of the average human eye, a scanning light source covering the spectrum of the photopic curve is used. This consists of a tungsten-halogen lamp and a monochromator. The tungsten-halogen lamp outputs white light covering the spectrum of the photopic curve. The monochromator scans the spectrum of the light source in discrete bands of 5–10 nm. The bands of light are coupled to the optical sensor 12 which converts the light into electrical signals representative of the light passing through each of the optical filter elements 18–24. Since each of the optical filter elements 18–24 selectively decreases the transmittance of light in specific spectral regions, the current outputs from each photosensitive region 28–34 for each spectral band will vary as a function of the spectral transmittance of each filter element 18–24. The current signals from the photosensitive regions 28–34 are converted to voltage signal via the transimpedance amplifiers 36–42 and summed in summing circuit 44. The output of the summing circuit 44 for each spectral band is coupled to a display device, such as a computer, storage display oscilloscope, or the like. The displayed output of the discrete bands shows the spectral response of the optical sensor 12. This response is compared to the desired spectral response and adjustments are made to the feedback variable gain resistors 56–62. Another acquisition of display data is made and the corrected spectral response of the optical sensor 12 is again compared to the desired spectral response curve. This adjusting of the amplified outputs of the photosensitive regions and comparing the summed outputs to the desired spectral response curve is repeated until an optimum spectral response is achieved for the optical sensor 12. Electrically adjusting an optical sensor 12 having a mosaic filter 14 is substantially easier and less costly than repeatedly sizing and placing optical filter elements 18–24 on the optical substrate 16 and testing for the proper spectral response.

Figure 3:
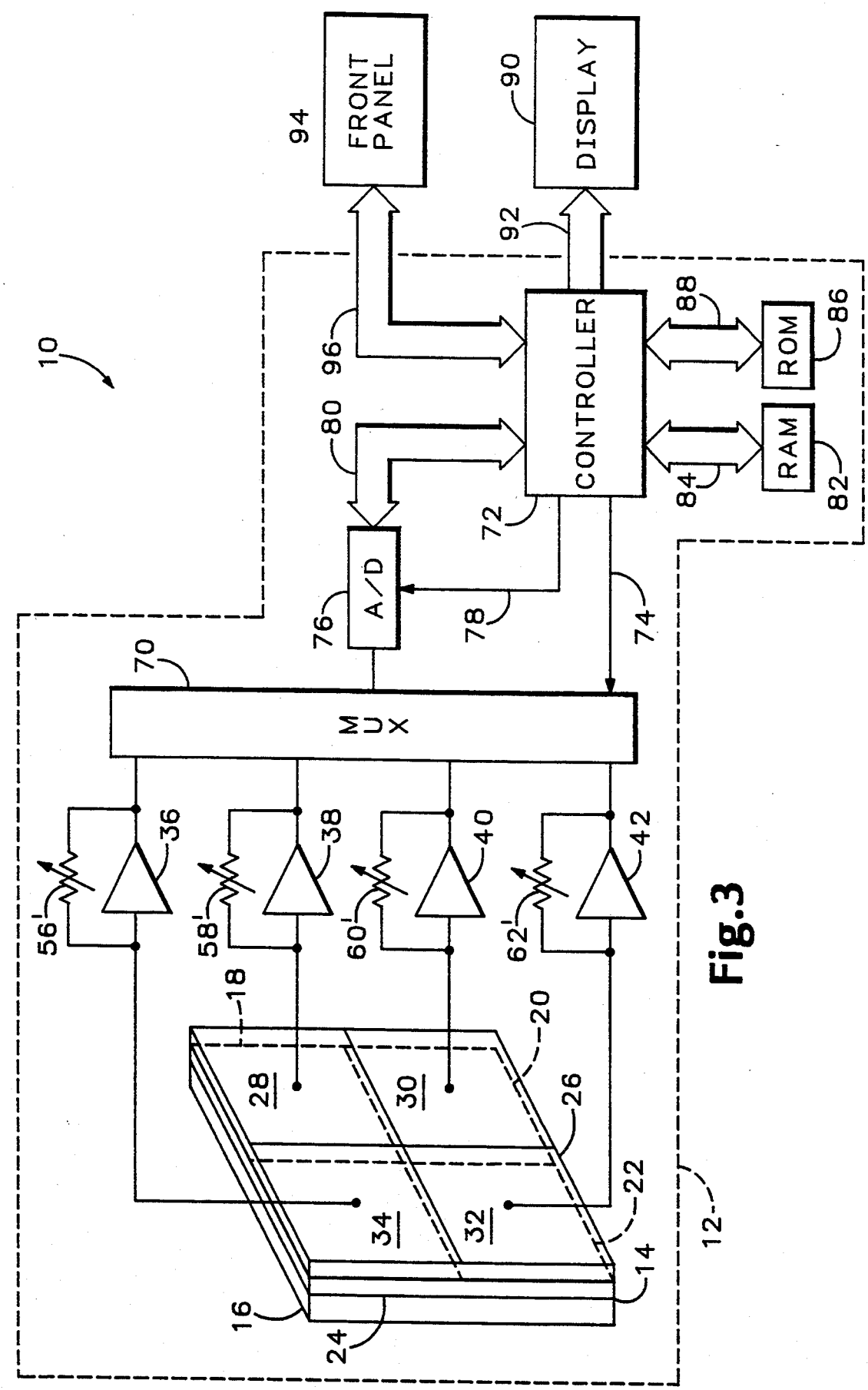
FIG. 3 is a digital implementation of the optical sensor according to the present invention as used in an optical measurement instrument.

FIG. 3 shows a digital implementation of the optical sensor 12 according to the present invention. Like elements in FIG. 1 are labeled the same in FIG. 3. The mosaic filter 14 and the photosensitive device 26 are the same for the digital implementation as in the analog implementation. The current outputs from the photosensitive regions are coupled to the respective inputs of transimpedance amplifiers 36–42. Each transimpedance amplifier 36–42 generates a voltage signal proportional to the respective input current signals as a function of feedback resistors 56', 58', 60', 62' in shunt with their respective amplifiers 36–42. One difference between the analog and the digital implementations is that the amplified outputs of the photosensitive regions in the digital design are not varied as a function of the feedback resistors 56', 58, 60' 62'. The voltage outputs of the transimpedance amplifiers 36–42 are coupled to separate inputs of multiplexer (MUX) 70. The MUX 70 selectively couples the respective amplified voltages on its input to its output in response to control signals from controller 72 via control line 74. The voltages on the inputs of MUX 70 are selectively coupled to the output of the MUX in response to signals from the controller 72. The MUX 70 output is coupled to an analog-to-digital (A/D) converter 76 which converts the respective voltages from the amplifiers 36–42 to digital values representative of each of the voltages. The A/D converter 76 receives control signals from the controller 72 via control line 78. The output from the A/D converter 76 is coupled to the controller 72 via data bus 80. The controller 72, under program control, stores the digital values in RAM 82 via data and address bus 84 for subsequent retrieval and further processing. Permanent data and programs for controlling the operation of the optical measurement instrument are stored in ROM 86, which is coupled to the controller 72 via data and address bus 88. The stored digital data representative of the amplified outputs of the photosensitive regions is varied and summed in the controller 72 under program control using correction factors previously stored in ROM 86 during the calibration procedure to substantially match the spectral response of the optical sensor 12 to the desired spectral response curve. A display 90 is coupled to the controller 72 via bus 92 for displaying the processed digital data. Operator control for the optical measurement instrument 10 is provided by a front panel 94 connected to the controller 72 via bus 96.

Calibration of the optical sensor 12 in a digital environment is similar to analog calibration in that a spectroradiometer is used as a light source for the optical sensor 12. However, instead of a technician manually adjusting the feedback variable gain resistors 56–62, the summed digital values representative of the amplified outputs of the photosensitive regions 28–34 are coupled to an external processor, such as a personal computer. The computer has stored in it the desired spectral response curve for the optical sensor 12. As with the analog calibration, the digital values representing the discrete bands of the spectrum are summed and displayed on the computer. Calibration algorithms compare the digital values for the discrete bands against the stored desired spectral response curve and produce correction factors that are applied to the respective digital values. The acquisition of discrete spectral bands of digital data and their comparison against the stored spectral response curve values to produce correction factors continues until there is a substantial match between the spectral response of the optical sensor 12 and the desired spectral response curve. The correction factor data is then permanently stored in ROM 86.

An optical sensor using a mosaic filter has been described where the calibration of the filter is accomplished electrically instead of physically changing the size and position of the optical filter elements of the filter. This substantially reduce the cost and complexity of the sensor design. The optical sensor has a photosensitive device containing a plurality of photosensitive regions with each photosensitive region being positioned behind one of the optical filter elements. The outputs of the photosensitive regions are amplified, varied and summed together to produce an output substantially matching a desired spectral response curve. These and other aspects of the present invention are set forth in the appended claims.

What is claimed is:

1. An electrically adjusted mosaic filter for producing an output substantially matching a desired spectral response curve comprising:

a mosaic filter having a plurality of optical filter elements disposed on an optical substrate approximating a desired spectral response curve with each filter element having a spectral response for selectively decreasing the transmittance of light passing through the mosaic filter in a specific spectral region;

a photosensitive device disposed adjacent to the mosaic filter having a plurality of photosensitive regions with each region converting the spectral response of each of the optical filter element-optical substrate combinations to an electrical signal;

means for amplifying each of the electrical signals from the respective photosensitive regions;

means for varying the amplified outputs of each of the photosensitive regions; and means for summing the varied amplified outputs of the photosensitive regions to produce an output substantially matching the desired spectral response curve as a function of varying the amplified outputs of the photosensitive regions.

2. The electrically adjusted mosaic filter as recited in claim 1 wherein the photosensitive device comprises a multiple quadrant photodiode.

3. The electrically adjusted mosaic filter as recited in claim 1 wherein the photosensitive device comprises a photodiode array.

4. The electrically adjusted mosaic filter as recited in claim 1 wherein the photosensitive device comprises discrete photodiodes.

5. The electrically adjusted mosaic filter as recited in claim 1 wherein the amplifying means comprises a plurality of amplifiers with each amplifier having an input coupled to receive one of the electrical signals from the photosensitive regions and an output having a voltage thereon proportional to the input signal.

6. The electrically adjusted mosaic filter as recited in claim 5 wherein the varying means comprises a plurality of variable feedback resistors with each resistor coupled between the input and output of one of the plurality of amplifiers.

7. The electrically adjusted mosaic filter as recited in claim 1 wherein the summing means comprises a summing amplifier.

8. The electrically adjusted mosaic filter as recited in claim 5 wherein the varying means comprises:

means for converting the each of the respective voltages on the amplifier outputs to digital values representative of each of the voltages; and a memory for storing the digital values representative of each of the respective voltages and digital correction factor values generated during calibration as a function of comparing the spectral response of the mosaic filter to the desired spectral response curve; and a controller for varying and summing the digital values using the digital correction factor values to substantially match the mosaic filter to the desired spectral response curve.

9. The electrically adjusted mosaic filter as recited in claim 8 wherein the converting means comprises:

a switching means having multiple inputs for receiving the respective voltages on the outputs of the amplifiers for selectively coupling each of the respective voltages therethrough to an output;

an analog-to-digital converter coupled to the output of the switching means for converting each of the respective voltages to digital values;

means for storing the digital values from the analog-to-digital converter; and means for controlling the switching means, the analog-to-digital converter, and the storing means.

10. The electrically adjusted mosaic filter as recited in claim 9 wherein the switching means is a multiplexer receiving switching control signals from the controlling means.

11. The electrically adjusted mosaic filter as recited in claim 1 wherein the summed outputs from the summing means produces a spectral response substantially matching that of the average human eye.

12. The electrically adjusted mosaic filter as recited in claim 1 wherein the summed outputs from the summing means produces a substantially flat spectral response over a spectral region from 450 nm to 950 nm.

* * * * *